United States Patent [19]
McIntyre et al.

[11] Patent Number: 5,583,352
[45] Date of Patent: Dec. 10, 1996

[54] LOW-NOISE, REACH-THROUGH, AVALANCHE PHOTODIODES

[75] Inventors: Robert J. McIntyre, Pointe Claire; Paul P. Webb, Beaconsfield, both of Canada

[73] Assignee: EG&G Limited, Vaudreuil, Canada

[21] Appl. No.: 236,222

[22] Filed: Apr. 29, 1994

[51] Int. Cl.⁶ .................. H01L 31/0328; H01L 31/107; H01L 31/075; H01L 31/00
[52] U.S. Cl. .................. 257/186; 257/438; 257/458; 257/459; 257/465
[58] Field of Search .................. 257/186, 292, 257/481, 603, 438, 458, 459, 465; 437/23, 25, 86, 180, 247

[56] References Cited

U.S. PATENT DOCUMENTS

| | | |
|---|---|---|
| 3,886,579 | 5/1975 | Ohuchi et al. . |
| 4,083,062 | 4/1978 | Ohuchi et al. . |
| 4,326,211 | 4/1982 | Smeets . |
| 4,458,260 | 7/1984 | McIntyre et al. . |
| 4,463,368 | 7/1984 | McIntyre et al. . |
| 4,700,209 | 10/1987 | Webb .................. 257/186 |
| 4,740,819 | 4/1988 | Ouichi et al. .......... 257/186 |
| 4,816,890 | 3/1989 | Ouichi et al. .......... 257/186 |
| 4,972,242 | 11/1990 | McIntyre . |
| 5,179,431 | 1/1993 | Shirai . |
| 5,187,553 | 2/1993 | Makita . |

FOREIGN PATENT DOCUMENTS 3009565  1/1991  Japan .................. 257/438

Primary Examiner—Sara W. Crane
Assistant Examiner—Valencia Martin Wallace
Attorney, Agent, or Firm—Lee & Hollander

[57] ABSTRACT

A new reach-through APD structure which includes a five-layer, double-drift-region, double-junction device, having a $p^+$-p-n-$p^-$-$n^+$ structure. The middle three layers of the new APD constitute most of the thickness of the device and are fully depleted when the device is biased to its normal operating voltage. In the present invention, only primary carriers generated in the relatively narrow first drift region are subject to the full avalanche gain, resulting in dark current and noise levels much lower than conventional reach-through APD's. The new structure can be used to fabricate integrated arrays of APD's. These arrays are more durable and easily fabricated than are prior art APD's. Additionally, the new array structure does not require segmentation or isolation of the multiplying regions of the different elements of the array, allowing arrays to be made with little or no dead space between elements.

16 Claims, 4 Drawing Sheets

LOW-NOISE, REACH-THROUGH, AVALANCHE PHOTODIODES

FIELD OF THE INVENTION

This invention is related to avalanche photodiodes, and in particular to low-noise avalanche photodiodes suitable for detecting short wavelength photons.

BACKGROUND OF THE INVENTION

The avalanche photodiode (APD) is a semiconductor device that can detect extremely low levels of electromagnetic radiation. An APD is constructed so that an electron dislodged by a photon will hit other atoms in the silicon of the APD with sufficient velocity and energy so that additional hole-electron pairs are created by the collisions. Typically a free electron will create a number of hole-electron pairs, and the electrons from these pairs will, in turn, create additional electrons, thus creating an "avalanche" process. This multiplication of electrons gives the APD an effective gain and allows detection of very low light levels.

One potential use for APD's is in detecting the output of scintillating crystals used to detect gamma rays in such fields as high energy physics experiments, nuclear medicine, and PET cameras. Currently, photomultiplier tubes (PMT's) are the principle device used to detect scintillator outputs. APD's would have many advantages over PMT's due to their higher quantum efficiency, small size, and insensitivity to external magnetic fields. In applications such as PET imaging, the ability to create large arrays of APD's with much finer positional resolution than PMT's would be advantageous.

The output wavelengths from the most commonly used scintillators is in the range of 350 to 550 nm, and currently known types of APD's capable of detecting light at these wavelengths have disadvantages which render them of limited suitability for use as scintillator detectors. FIG. 1A illustrates a conventional reach-through APD. The substrate is a p$^-$-type layer 4. The p-n junction is created by a diffusing more highly-doped p-type layer 6 into the bottom surface of the APD, followed by a shallower n-type layer 8. Due to the higher doping of the p-type layer 6, the high field is concentrated in a narrow region surrounding the junction of layers 4 and 6. The value of the electric field over the path denoted by the line a–b in FIG. 1A is shown in FIG. 1B. These types of APD's are made in a variety of sizes and thicknesses.

The reach-through APD is characterized by a relatively low-field drift region 10, shown by the low field strength plateau on the left of FIG. 1B, followed by a narrow, high-field multiplying region within the p-type layer 6, represented by the spike at the right in FIG. 1B. Photons impinging on the top surface 2 create hole-electron pairs. Even though the field in region 10 is much lower than in the narrow multiplying region, electrons and holes which are created in this region are still collected rapidly, and charge collection in this device is fast. However, no multiplication occurs in this region. When an electron enters the high field in the multiplying region, its energy increases to the point where it has a significant probability (called the ionization coefficient) of knocking loose another electron. The two electrons, and to a lesser extent the hole, can then have further ionizing collisions. This process is generally referred to as avalanche gain.

The prior art reach-through APD structure shown in FIG. 1A suffers from the disadvantage that any thermally generated electrons created in area 10 are multiplied by the same gain factor as electrons created by impinging photons, resulting in high background noise. Due to the width of this region, typically in the range of 30 to 150 μm, significant noise is produced by thermally-generated hole-electron pairs. A second disadvantage of this structure is that achieving a low value of $k_{eff}$ (a weighted ratio of the ionization coefficients of holes to electrons) requires a very long and expensive diffusion. A third disadvantage is that reach-through APD's are very thin, typically 150 μm or less in thickness, and are generally fabricated using small silicon wafers of two inches or less to reduce breakage to an acceptable level. Most automated wafer handling systems are set up to handle conventional four-inch silicon wafers and cannot be used to fabricate these types of APD's. This keeps manufacturing costs high. The delicate nature of these APD's also make them less suitable for fabricating large array structures.

Another type of prior art APD is the deep-diffused, beveled-edge APD using neutron-transmutation-doped silicon, shown in FIG. 1C. In these diodes, a p-type top layer 10 is deeply diffused into an n-type substrate 14. An n$^+$ diffusion provides an ohmic contact on the bottom of the APD. The depletion region extends between the dotted lines 18. Hatched region 15 is the multiplying region in which the depletion field is high enough to cause gain. Due to the relatively low value of the maximum field in the multiplying region, the $k_{eff}$ values for this type of APD can be made relatively low.

These APD's suffer from several disadvantages, however. They require very high bias voltages, on the order of 1500 to 2500 volts, which makes circuit design more difficult and creates problems with breakdown along the edges of the device. The beveled edge is designed to reduce the field strength along the edge of the diode to prevent breakdown. Even so, it is difficult to passivate the beveled edge using conventional techniques. This increases manufacturing expense and decreases the reliability. The requirement for a beveled edge makes fabrication of arrays difficult due to the need to cut into the bottom of the device to make the beveled edge. Additionally, since the depletion layer 18 does not extend to the surface of the APD, collection of primary carriers is slow which increases timing uncertainty and the number of false background counts in applications where the APD is gated during intervals when photons are being collected, such as in PET imaging.

SUMMARY OF THE INVENTION

The present invention includes a new reach-through APD structure which is particularly suitable for use with short wavelength light such as that used in scintillator detectors. The APD of the present invention is a five-layer, double-drift-region, double-junction device, having a p$^+$-p-n-p$^-$-n$^+$ structure. The middle three layers of the new APD constitute most of the thickness of the device and are fully depleted when the device is biased to its normal operating voltage. In the present invention, only primary carriers generated in the relatively narrow first drift region are subject to the full avalanche gain. The width of this region is typically only a few percent of the depletion layer. Thus, most thermally generated carriers are produced in the second drift region and undergo relatively low gain, resulting in lower dark-current noise. The present invention can achieve dark current and noise levels much lower than conventional reach-through APD's.

In the new APD, the high-gain region is located close to the surface of the device, with the doping profile in the p layer adjusted so that the multiplying region starts at a depth of 3 to 4 μm, which is sufficient to fully absorb all the light in the 400 to 550 nm wavelength range. The device is suitable for being fabricated using conventionally-sized silicon wafers and automated wafer handling machinery. The new structure can be used to fabricate integrated arrays of APD's. These arrays are more durable and easily fabricated than are prior art APD's. Additionally, the new array structure does not require segmentation or isolation of the multiplying regions of the different elements of the array, allowing arrays to be made with little or no dead space between elements.

DESCRIPTION OF THE DRAWINGS

The advantages and operation of the present invention are more fully described in the following description of the preferred embodiment and by reference to the drawings, of which.

DESCRIPTION OF THE PREFERRED EMBODIMENT

Figure 2:
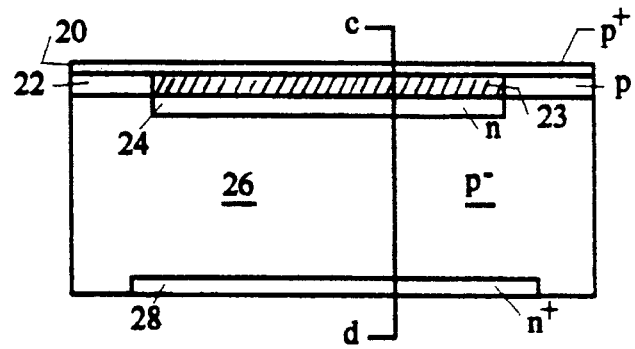
FIG. 2 shows the basic structure of the new APD of the present invention.

The operation and advantages of the new APD structure are best explained with reference to FIG. 2, which illustrates the essential structural features of the new APD, in conjunction with FIG. 3, which shows the electric fields in the APD at different bias voltages. In FIG. 2, an n-type layer 24 is created in a high-resistivity, p⁻ substrate 26. After the n layer 24 is formed, a p-type layer 22 is formed on top of layer 24 with a thickness of about 3 to 4 μm. A very thin p⁺ top layer 2 and an n⁺ bottom layer 8 provide the anode and cathode contacts respectively. Thus, the structure in FIG. 2 is a p⁺-p-n-p⁻-n⁺ structure in which the middle three layers are fully depleted, as described below. The peak electric field is at the point where the n and p layers 24 and 22 have equal concentrations. Multiplication (gain) takes place within a layer which extends a short distance on either side of this junction. The first drift region, in which photon absorption takes place, has a thickness somewhat less than the full thickness of p-type layer 22 and is essentially that portion of layer 22 above the multiplication region. This is shown approximately by the hatched region 23 in FIG. 2.

Photons impinging on the top surface of the APD within the sensitive layer defined by the multiplying region 23 create hole-electron pairs in layer 22. For scintillators operating in the 400–550 μm wavelength range, the 3–4 μm thickness of the first drift region 23 is sufficient to fully absorb all of the photons. Electrons created in region 23 are accelerated by the high depletion layer field, as described below, and are multiplied by the avalanche process. Thus, the primary drift region 23, from which electrons liberated by photons are collected and multiplied by the avalanche process, is essentially limited to a portion of the p-type region 22. A secondary drift region is below n-type layer 24 in the p⁻ substrate 26. For electron-hole pairs created in this region, thermally or otherwise, the collected carriers are holes, which contribute much less to the noise of the APD due to the relatively low ionization coefficient of holes as compared with electrons.

Figure 3:
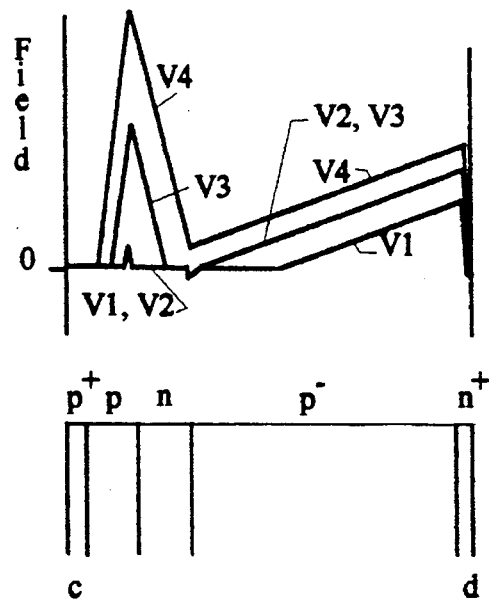
FIGS. 3 and 4 show the electric field and gain profiles for the device of FIG. 2.

FIG. 3 is a graph of the electric field inside the APD of FIG. 2 along line c–d for different values of reverse bias voltage. The vertical axis represents the field strength, and the horizontal axis represents the distance into the device, with the origin being the top. The relative positions of the boundaries between each of the layers is shown below the graph in FIG. 3. Field values are shown for four different values of reverse bias, increasing from V1 to V4. The graph of FIG. 3 is simplified for purposes of this explanation. The values shown approximate those that would exist if the doping levels in the various layers were constant, rather than varying with depth as in an actual device; and the relative widths of the layers are not to scale to make the field structure easier to understand.

For small values of reverse bias, the junction between layers 28 and 26 is only partially depleted, as shown by the curve designated as V1 in FIG. 3. Apart from the intrinsic depletion regions associated with the two junctions on either side of layer 24 (shown by the small positive and negative peaks in the line denoted V1–V2), the field in the multiplying region 23 is zero.

When the bias voltage is increased to a voltage V2, the p⁻ layer 26 becomes fully depleted. This is shown by line V2. As the bias voltage increases above voltage V2, electrons are able to escape from the n-type layer 24, and a second depletion layer is established at the p-n junction between layers 22 and 24, as shown by line V3. Once this field becomes sufficiently high, impact ionization, or "avalanching" occurs, resulting in gain. If the donor concentration in n-type layer 24 is properly chosen, the n-type layer 24 becomes fully depleted while the gain is still finite. Further increases in the bias voltage increase the field everywhere in the diode, since the diode is fully depleted, as shown by line V4.

Figure 4:
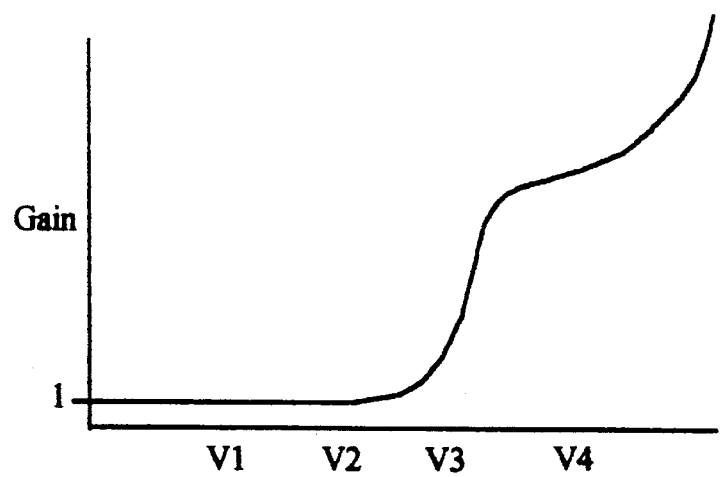

FIG. 4 shows the gain of the APD versus the applied bias voltage. The gain is unity for bias voltages up to the value between V2 and V3 where the field near the junction becomes high enough for impact ionization to occur thus creating secondary carriers. At this point the gain goes above unity and continues to rise with increasing bias voltage until the n-layer 24 is fully depleted at a voltage between V3 and V4. At this point the gain levels off, as shown by the plateau in gain between V3 and V4. As the voltage is increased further, the gain rises slowly until breakdown is reached.

Figure 1A:
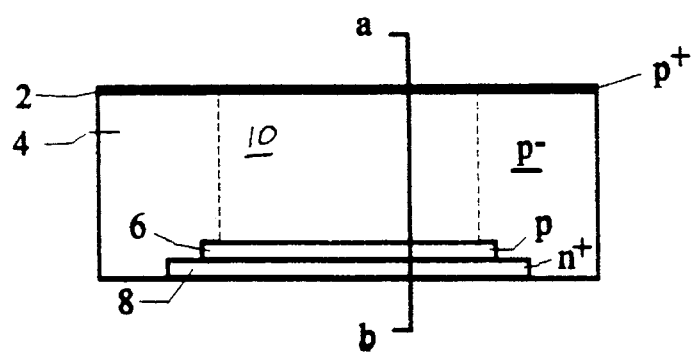
FIGS. 1A, 1B, and 1C illustrate the structure and operation of prior art APD's.
Figure 1B:
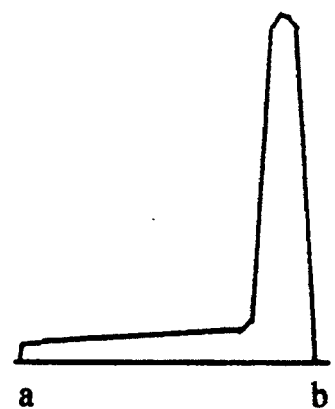
Figure 1C:
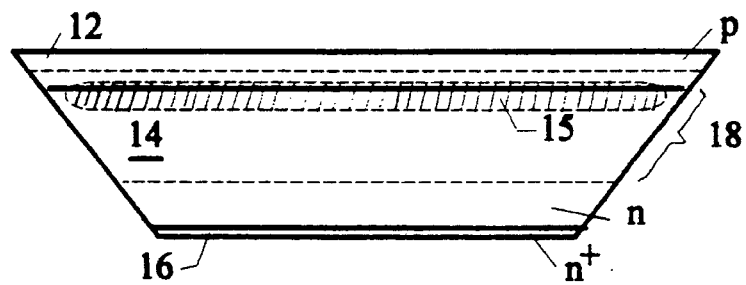

The structure shown in FIG. 2 has several advantages over prior art structures. First, the noise from thermally-generated hole-electron pairs is much less than with prior art reach-through APD's. In a conventional reach-through APD, such as that shown in FIG. 1A, the area 10 from which electrons are gathered by the multiplying region constitutes about 90% of the thickness of the device, which may be in excess of 100 μm. In the present invention only electrons created in the 3–4 μm thick non-multiplying portion of region 22 are gathered by the multiplying region. For hole-electron pairs generated in the substrate 26 below the multiplying region (the secondary drift region), the carriers which enter the multiplying region are holes, and the average gain for holes is much less than for electrons, resulting in a much lower dark current value. In devices fabricated with the structure of FIG. 2, the multiplied dark current has been reduced by more than a factor of 5 compared to conventional reach-through APD's.

A second advantage is that the structure of FIG. 2 allows the thickness of the wafer forming the substrate 26 to be increased with a much smaller increase in dark current and resulting noise than would be the case with a conventional reach-through APD. The present invention can be fabricated using standard, 4-inch diameter wafers 300 µm thick or more.

Another advantage is that a common multiplying region can be used in an array of devices using the structure of FIG. 2. This allows segmentation between array elements to be provided by segmentation of only the cathodes 28 formed by the $n^+$ cathode, as explained in more detail with reference to FIG. 6 below. This is not possible with convention reach-through APD's since segmentation of the $n^+$ layer 8 (see FIG. 1A) without providing isolating regions between the cathode segments results in breakdown in the region between the elements. In the present invention, the field perturbation in the multiplying region caused by segmentation of $n^+$ layer 28 should be very small due to the relatively large distance between the multiplying region and the $n^+$ layer. This distance can be as large as 300 µm or greater while still providing acceptable noise performance. In addition to reducing the complexity and cost of array-type devices, this type of device has no dead space between elements.

Figure 5:
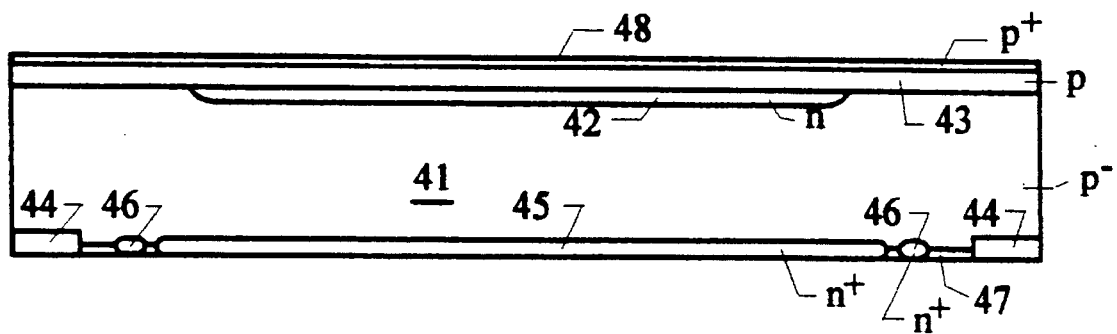
FIG. 5 is a diagram of a single element APD of the present invention as it would be fabricated.
Figure 6:
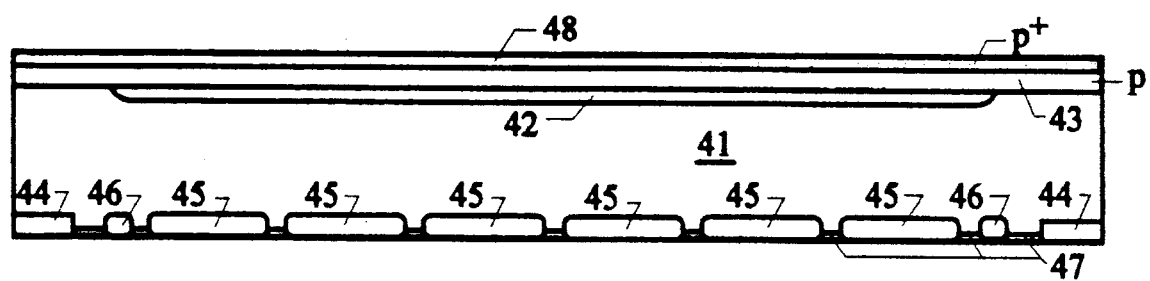
FIG. 6 is a diagram of a multi-element APD constructed in accordance with the present invention.

FIGS. 5 and 6 show the new APD structure as it would be embodied in actual devices. FIG. 5 shows the structure of a single element device. FIG. 6 shows the structure of a multi-element structure which can be used to fabricate an array of APD's. For both FIGS. 5 and 6, the starting material is a $p^-$-type wafer of high resistivity which forms the substrate 41. A uniform layer of n-type material is deposited over the desired area of photon reception, as defined by a photomask, preferably by ion implantation. This layer is subsequently diffused to the desired depth to form region 42 in FIG. 5. A p-type layer of material is then deposited and diffused to a depth less than that of the n-type region 42 to form region 43. A similar p-type layer which will form the channel-stop region 44 may be deposited and diffused at the same time as region 43. Next $n^+$-type material is deposited and diffused to form the cathode 45. In the single element structure of FIG. 5, a single cathode is formed, while in the array structure of FIG. 6, multiple cathodes are formed. In the same operation, an $n^+$-type guard-ring 46 surrounding the cathode or array of cathodes may be deposited and diffused. A lightly doped p-type surface control layer 47 may be deposited in the region between the channel stops to prevent the formation of undesirable inversion layers which might otherwise form under the oxide and provide leakage paths between the multiple cathodes in the array structure of FIG. 6. A shallow $p^+$ layer 48 is then deposited and diffused over the entire top surface of the device to form a thin window. This layer 48 may act as a gettering layer. Alternatively an additional p-type gettering layer may be deposited earlier and then be partially or entirely removed after a gettering step and before deposition of the window layer 48.

Not shown in FIGS. 5 and 6 are various layers, described below, which would be formed using techniques standard in the art. Passivating layers preferably made of $SiO_2$ capped by $Si_3N_4$ are formed at appropriate stages during the processing to cover the surfaces between the multiple cathode elements 45 and the guard ring 46, and especially between channel stop 44 and guard ring 46 where a high surface field will exist during operation. Additional protection may be added to prevent moisture and ionic contaminants from accumulating on top of the passivating layers. The metallization layer providing connections to regions 44, 45, 46, and 48 would be deposited and etched.

The following are representative dimensions and doping levels for a device of the type shown in FIGS. 5 and 6. The substrate 41 is 100 to 400 µm thick. For an array structure fabricated on 4-inch wafers, the thickness is preferably at least 300 µm. Doping levels are preferably less than $2\times10^{12}$ acceptors/cm$^3$, preferably in the <100> crystal orientation.

The n-type layer 42 preferably has 3 to $5\times10^{12}$ donors/cm$^2$ remaining after the diffusion and surface cleaning or etching process, the exact value depending on the desired operating gain. The diffusion length is typically 5 µm or more, depending on the desired $k_{eff}$ value. The n-type and p-type impurities of regions 42 and 43 can optionally be deposited and then diffused simultaneously, as mentioned above, in which case the total areal concentrations will be higher.

The p-type layer 43 is preferably ion implanted and then diffused. Areal concentrations is typically $10^{13}$/cm$^2$ remaining after out-diffusion. The doping concentration of channel stop layer 44 is not critical, but is typically at least about $10^{13}$/cm$^2$. The $n^+$-type cathode(s) 45 and guard ring 46 may be deposited or implanted simultaneously through a common mask. Doping level is not critical, but is typically about $10^{15}$/cm$^2$. Junction depth is preferably 3 µm or greater, to prevent premature breakdown due to field enhancement from the junction edge curvature of the guard ring 46. In the multi-element array of FIG. 6, the lateral separation between cathode elements after diffusion is preferably 5 to 20 µm. Larger separation will reduce interelectrode capacitance but will increase the gain in the multiplying region opposite the separation.

Alternatively, the doping profiles in the n-type layer 42 and the p-type layer 43 can be obtained with multiple depositions and diffusions. While this adds complexity to the processing, it introduces a means of adjusting the depth of the multiplying region and the electric field profile within it. This is discussed further below.

Surface control layer 47 is an optional, lightly doped, p-type layer. This layer may not be necessary if the passivating oxide is sufficiently pure that the electric field is adequate to fully deplete any inversion layer that may be produced by undesired charge in the oxide. Although layer 47 is shown in FIGS. 5 and 6 as terminating at the edges of the channel stops 44, it may also extend over the entire back surface, to eliminate a masking step.

The $p^+$-type window layer 48 may be formed with a single diffusion or with sequential diffusions separated by an etching step. It's function is both to achieve an adequate $p^+$-type surface layer to avoid carrier injection from the light entry surface of the APD packaging, and to provide gettering of at least the portion of the depletion layer where the gain is high while maintaining a thin dead layer in order to maximize the quantum efficiency in the 400 to 550 µm wavelength range. Optionally, the portion of layer 48 over the active area immediately above region 42 may be partially or totally etched followed by redeposition of a very shallow $p^+$ layer in order to achieve the thin dead layer needed for good quantum efficiency.

The shape of the electric field profile in the multiplying region will determine the characteristics of the device. As described above, the n-type and p-type layers 42 and 43 are formed by diffusion. Although helpful for purposes of explanation, the field profiles shown in FIG. 3 do not represent the actual profiles achieved by diffusion. For diffused layers and assuming Gaussian impurity profiles for these layers, the electric field for a device with a fully depleted n-layer 42 is given by;

$$E(x) = E_0 + \frac{q}{\epsilon} \left( N_{d1} \text{erfc}\left(\frac{x}{2L_{d1}}\right) + N_{d2} \text{erfc}\left(\frac{x}{2L_{d2}}\right) - N_{a1} \text{erfc}\left(\frac{x}{2L_{a1}}\right) - N_{a2} \text{erfc}\left(\frac{x}{2L_{a2}}\right) + N_{a0} x \right) \quad (1)$$

where $N_{d1}$, $N_{d2}$, $N_{a1}$, and $N_{a2}$ are the concentrations per unit area of different donor and acceptor depositions of layers 42 and 43, $L_{d1}$, $L_{d2}$, and $L_{a1}$, and $L_{a2}$ are their diffusion lengths, $N_{a0}$ is the acceptor concentration per unit volume of the p⁻ layer 41, and $E_0$ is a constant approximately equal to $(V-V_d)/w$, where V is the applied voltage, $V_d$ is the voltage necessary to deplete the n-layer 42, and w is the total diode thickness. This equation does not include the contribution of the very shallow surface p⁺ diffusion 48 which is not depleted and does not contribute to the electric field. This equation allows for multiple acceptor and donor species. Where a single acceptor and/or donor species is used, $N_{a2}$ and/or $N_{d2}$ will be zero.

Given the electron and hole ionization coefficients, α and β, the above equation can be used to calculate the gain and effective k value as follows:

$$g(x) = \exp\left(-\int_0^x (\alpha - \beta) dx\right) \quad (2)$$

$$M = \frac{1}{1-I_1} \quad k_{eff} = 2I_2 - 1 \quad (3)$$

where $$I_1 = \int_0^w \alpha g(x) dx \quad I_2 = \int_0^w \alpha g^2 dx \quad (4)$$

Figure 7A:
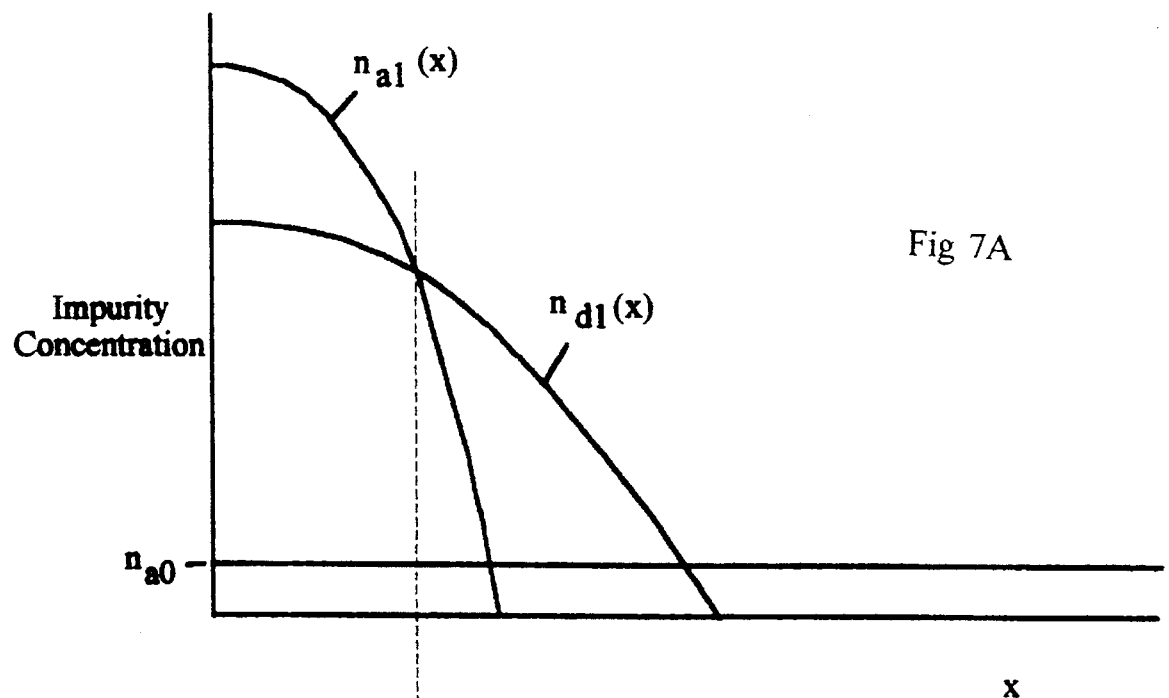
FIGS. 7A, 7B, 7C, 8A and 8B are graphs helpful in explaining the effects of varying diffusion parameters on the operation of the invention.

FIG. 7 shows typical profiles which might occur in an actual device. In FIG. 7A, a diffusion of a donor dopant produces a doping profile represented by the curve labeled $n_{d1}(x)$ to produce n-type layer 42. The p-type layer 43 is diffused to a lesser depth, as shown by curve $n_{a1}(x)$. The line labeled p⁻ represents the charge from the p⁻ substrate 41. Since the p⁺ layer 48 is not depleted, its contribution to the field is zero.

Figure 7B:
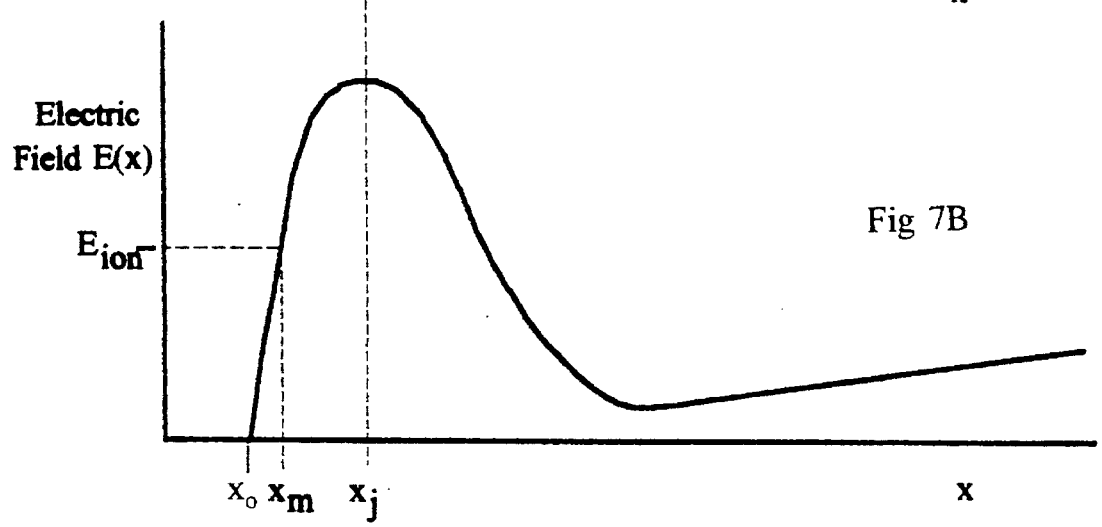

FIG. 7B shows the electric field in the APD when biased at an operating voltage that fully depletes the n-layer 42. The p-n junction between layers 42 and 43 is defined as the point where the donor and acceptor charge are equal and occurs at position $x_j$. Assuming that ionization occurs when the field is $E_{ion}$, the multiplying region starts at the point labeled $x_m$. The depletion region begins in the p-type region at distance $x_0$.

Figure 7C:
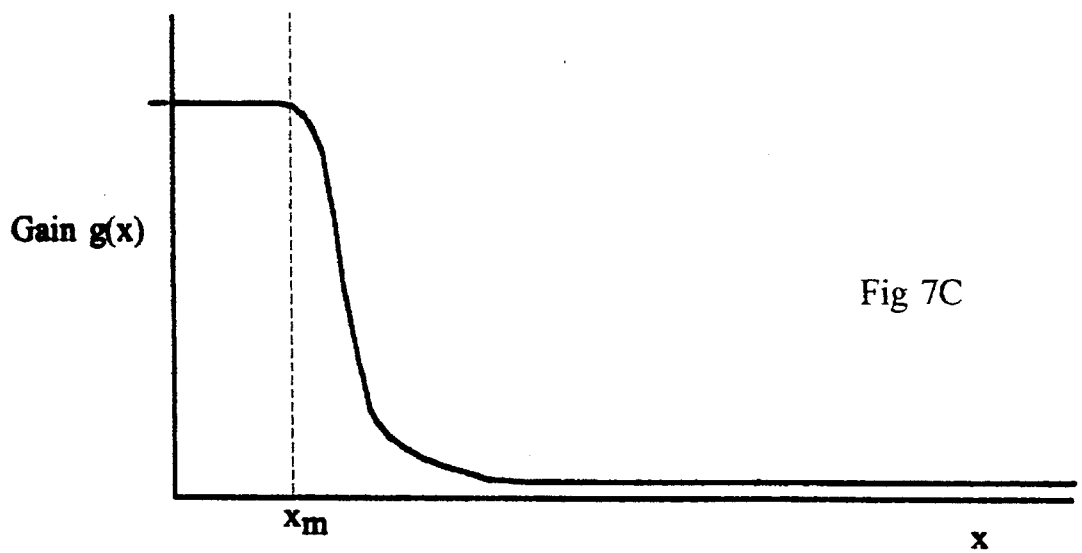

FIG. 7C shows how the gain varies with depth in the APD. The gain is a constant value from the surface of the APD down to the beginning of the multiplying region, $x_m$. Electrons and holes created below this point traverse a lesser distance through the high-field region and are statistically less likely to have ionizing collisions, and the gain drops almost to unity at the junction $x_j$.

Table 1 below lists values for various different APD designs that have been computed using the above design equations. Actual physical devices corresponding with the parameters in the first line of Table 1 have been constructed and perform in accordance with the predictions of these equations. In Table 1, $x_0$ is the edge of the depletion layer; $x_1$ is the start of the multiplying layer, defined as the point where E=13 V/μm; $x_j$ is the junction depth or position of maximum field; and $V_a$ is the voltage at the point where $x=4 \times L_d$. The gain for all devices shown in Table 1 has been adjusted to 300. Table 1 shows values for devices created with both single and double acceptor diffusions. The single acceptor diffusions produce field and charge profiles of the general type shown in FIG. 7. Adding a second acceptor diffusion allows the impurity distribution to be manipulated to produce lower $k_{eff}$ values, as shown by the table.

An alternative embodiment of the device may be fabricated by depositing and simultaneously diffusing two donor and one acceptor species. The second donor is preferably done with a low dose and short diffusion length and has the effect of widening the first drift region. Typical dopants would be phosphorous and arsenic for the donors and boron as the acceptor. These dopants have diffusion constants roughly in the ratio of 12 to 1 to 6, respectively, and the diffusion lengths are proportional to the square root of the diffusion constant when diffused for the same times. In calculating the electric field for such a structure the equations above are used with the third error function term in equation 1 having $N_{a2}$ and $L_{a2}$ being replaced by $N_{d2}$ and $L_{d2}$ respectively and the sign of this term being changed from negative to positive. This method of fabrication can potentially achieve a lower $k_{eff}$ than the structure shown in Table 1.

Using two donor diffusions is also potentially useful in applications, such as PET imaging, where the collection time for electron crated by photons needs to be as short as possible to get the best timing resolution. With the doping profile shown in FIG. 7, the depletion field goes to zero at a distance $x_0$ below the surface of the diode. Photons absorbed above $x_0$ will be outside of the depletion field and will be moved towards the multiplying region by diffusion only, a much slower process than when propelled by the electric field. By doing a lightly-doped n-type diffusion which extends a short distance into the APD, the depletion layer can be extended to the surface of the APD. Thus all electrons created by photons (or otherwise) in the p-layer 43 will be quickly collected.

Figure 8B:
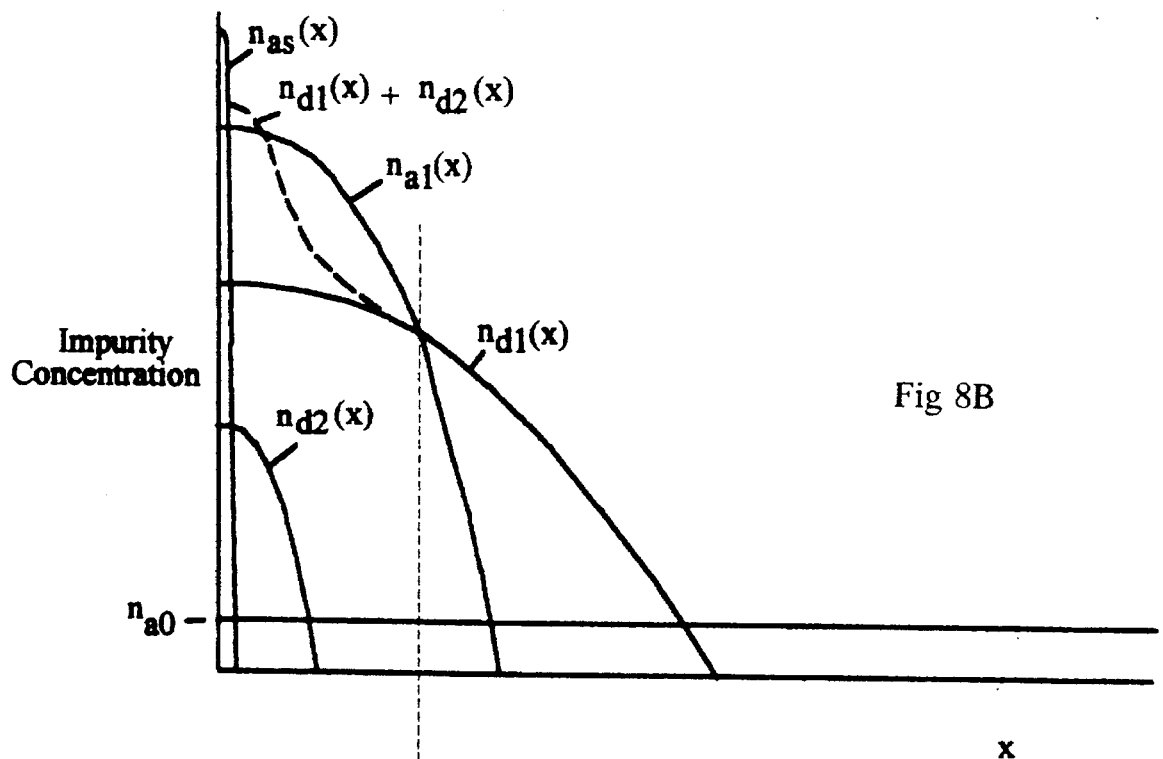
Figure 8A:
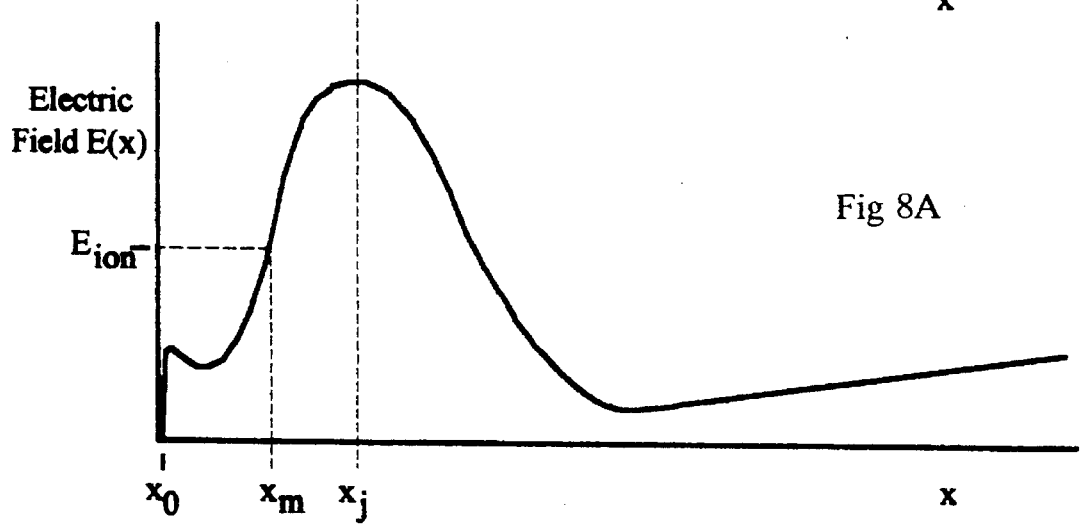

This is illustrated in FIGS. 8A and 8B. These figures show the charge concentration and fields in the APD and are similar to those shown in FIGS. 7A and 7B, with the addition of a second, shallow, n-type diffusion, shown by curve $n_2$ in FIG. 8A. The effective sum of the two donor species is shown by the dotted line in FIG. 8A. The effect on the field is to extend the depletion layer to the surface of the APD as shown in FIG. 8B. The gain is unchanged, since the extension of the depletion field does not raise the field above the ionization field threshold $E_{ion}$. The extension of the field will, however, result in electrons being collected vary rapidly from the entire region of p-layer 43.

The symbols in Table 2 are the same as for Table 1 with the second donor parameters replacing those for the second acceptor; the edge of the depletion layer, $x_0$ being measured from the shallow surface $p_+$ layer; and the start of the multiplying layer, $x_m$ being defined as the point where $g(x)=0.9$.

There has been described a new and useful avalanche photodiode which has advantages over those previously known in the prior art. While the operation and advantages of the invention have been described with reference to the exemplary embodiments described above, it should be appreciated that modifications to these embodiments will be made by those of ordinary skill in the art in applying the teachings of the invention to different situations and applications. Accordingly, the present invention should not be limited by the embodiments described above, but rather the scope of the invention should be interpreted only in accordance with the following claims.

TABLE 1

| $N_d \times 10^{12}$ | $L_d$ µm | $N_{a1} \times 10^{12}$ | $L_{a1}$ µm | $N_{a2} \times 10^{12}$ | $L_{a2}$ µm | $E_{max}$ V/µm | $V_a$ volts | $k_{eff}$ | $x_0$ µm | $x_1$ µm | $x_j$ µm |
|---|---|---|---|---|---|---|---|---|---|---|---|
| 3.60 | 5.0 | 0 | — | 10.0 | 1.3 | 28.6 | 207 | 0.0226 | 1.94 | 2.42 | 4.16 |
| 6.12 | 5.0 | 4.0 | 3.5 | 6.0 | 1.3 | 27.3 | 234 | 0.0171 | 1.68 | 2.30 | 4.48 |
| 8.55 | 5.0 | 8.0 | 3.5 | 2.0 | 1.3 | 26.1 | 257 | 0.0119 | 1.18 | 2.13 | 5.44 |
| 5.11 | 5.0 | 0 | — | 10 | 2.0 | 27.9 | 215 | 0.0178 | 2.48 | 3.20 | 5.52 |
| 6.97 | 5.0 | 4.0 | 3.5 | 6.0 | 2.0 | 27.2 | 233 | 0.0151 | 2.08 | 2.96 | 5.64 |
| 8.80 | 5.0 | 8.0 | 3.5 | 2.0 | 2.0 | 26.4 | 254 | 0.0121 | 1.28 | 2.54 | 5.90 |
| 8.08 | 5.0 | 0 | — | 10 | 3.0 | 26.7 | 242 | 0.0128 | 1.96 | 3.16 | 6.40 |
| 8.74 | 5.0 | 4.0 | 3.5 | 6.0 | 3.0 | 26.5 | 251 | 0.0119 | 1.48 | 2.82 | 6.30 |
| 9.39 | 5.0 | 8.0 | 3.5 | 2.0 | 3.0 | 26.2 | 263 | 0.0108 | 0.80 | 2.40 | 6.18 |
| 7.51 | 5.0 | 6.0 | 3.5 | 10.0 | 1.3 | 27.1 | 232 | 0.0168 | 2.44 | 3.00 | 5.16 |
| 11.9 | 5.0 | 14.0 | 3.5 | 10.0 | 1.3 | 26.6 | 237 | 0.0133 | 3.34 | 4.12 | 7.10 |

TABLE 2

| $N_d \times 10^{12}$ | $L_d$ µm | $N_{a1} \times 10^{12}$ | $L_{a1}$ µm | $N_{d2} \times 10^{12}$ | $L_{d2}$ µm | $E_{max}$ V/µm | $V_a$ volts | $k_{eff}$ | $x_0$ µm | $x_m$ µm | $x_j$ µm |
|---|---|---|---|---|---|---|---|---|---|---|---|
| 8.14 | 5 | 7.5 | 3.53 | 0.042 | 1.45 | 25.4 | 284 | 0.0100 | 0.0 | 1.83 | 5.18 |
| 9.67 | 5 | 10 | 3.53 | 1.01 | 1.45 | 25.7 | 289 | 0.0097 | 0.0 | 2.64 | 6.12 |
| 11.1 | 5 | 12.5 | 3.53 | 2.12 | 1.45 | 26.1 | 286 | 0.0114 | 0.0 | 3.89 | 6.78 |
| 12.3 | 5 | 15 | 3.53 | 3.35 | 1.45 | 26.4 | 275 | 0.0129 | 0.0 | 4.78 | 7.30 |

What is claimed is:

1. An avalanche photodiode for detecting photons and providing gain when operated at a reverse bias above a threshold voltage, comprising:

a substrate made of a p-type material and having a top surface and a bottom surface;

an n-type layer formed in the top surface of the substrate and extending a first distance down into the substrate;

a p-type layer formed in the top surface of the substrate over the n-type layer and extending down into the substrate a second distance less than the first distance;

wherein doping levels of the substrate, the n-type layer, and the p-type layer are such that avalanche multiplication occurs in a depletion region in the p-type layer when the photodiode is operated at a reverse bias above the threshold voltage, and wherein the n-type layer is completely enclosed by said p-type layer and said p-type substrate;

an $n^+$ layer formed in the bottom surface of the substrate;

means for providing an electrical connection to the $n^+$ layer;

means for providing an electrical connection to the p-type layer; and protection means covering the top surface of the substrate and the layers formed therein and adapted to let photons pass therethrough.

2. The photodiode of claim 1 wherein the means for providing electrical connection to the p-type layer includes a $p^+$ layer formed on the top surface of the p-type layer.

3. The photodiode of claim 2 wherein the substrate is a material formed of high-resistivity $p^-$-type material.

4. The photodiode of claim 3 wherein the depth of the depletion region in the p-type layer is about 3 µm or greater.

5. The photodiode of claim 3 wherein the substrate is at least about 300 µm thick.

6. The photodiode of claim 3 wherein the substrate is between about 100 µm to 400 µm thick.

7. The photodiode of claim 3 wherein the n-type layer and the p-type layer comprise two different donor-type dopants.

8. The photodiode of claim 3 wherein the n-type layer and the p-type layer are formed of at least one acceptor-type dopant and two donor-type dopants having concentrations and diffusion lengths such that the depletion region in the p-type layer extends to at least the top of the p-type layer when the diode is operated at or above the threshold voltage.

9. An avalanche photodiode array for detecting photons impinging upon a plurality of array elements and providing an amplified output signal representative of the photons impinging upon each of the elements, comprising:

a substrate made of a p-type material and having a top surface and a bottom surface;

an n-type layer formed in the top surface of the substrate and extending a first distance down into the substrate;

a p-type layer formed in the top surface of the substrate over the n-type layer and extending down into the substrate a second distance less than the first distance;

wherein doping levels of the substrate, the n-type layer, and the p-type layer are such that avalanche multiplication occurs in a depletion region in the p-type layer when the photodiode is operated at a reverse bias above a threshold voltage;

a plurality of separate cathodes formed of $n^+$ type material in the bottom surface of the substrate beneath the n-type layer formed in the top surface;

means for providing electrical connection to each of the separate cathodes;

means for providing a electrical connection to the p-type layer; and protection means covering the top surface of the substrate and the layers formed therein and adapted to let photons pass therethrough.

10. The photodiode array of claim 9 wherein the means for providing electrical connection to the p-type layer includes a $p^+$-type layer formed on the top surface of the p-type layer.

11. The photodiode array of claim 10 further comprising a guard ring surrounding the plurality of cathodes and formed by an n⁺-type material and a channel stop surrounding the guard ring and formed by a p-type material, both formed on the bottom surface of the substrate.

12. The photodiode array of claim 11 further comprising a passivating layer formed of $SiO_2$ capped by $Si_3N_4$ on the bottom surface of the photodiode array so as to cover the surfaces between the multiple cathodes and between the cathodes and the guard rings.

13. The photodiode array of claim 10 wherein the substrate is at least about 300 µm thick.

14. The photodiode array of claim 10 wherein the p-n junction between the p-type and n-type layer is at least 3 µm or greater below the top surface of the photodiode.

15. The photodiode array of claim 10 wherein the n-type and p-type layers are formed of at least one acceptor-type dopant and two donor-type dopants having concentrations and diffusion lengths such that the depletion region in the p-type layer extends to at least the top of the p-type layer when the diode is operated at or above a reverse bias voltage that provides gain.

16. The avalanche photodiode array of claim 9 wherein the n-type layer is completely enclosed by said p-type layer and said p-type substrate.

* * * * *